US007528443B2

(12) United States Patent
Kunii et al.

(10) Patent No.: US 7,528,443 B2
(45) Date of Patent: May 5, 2009

(54) SEMICONDUCTOR DEVICE WITH RECESSED GATE AND SHIELD ELECTRODE

(75) Inventors: Tetsuo Kunii, Tokyo (JP); Yoshitsugu Yamamoto, Tokyo (JP); Hirotaka Amasuga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 318 days.

(21) Appl. No.: 11/445,181

(22) Filed: Jun. 2, 2006

(65) Prior Publication Data

US 2007/0132021 A1    Jun. 14, 2007

(30) Foreign Application Priority Data

Dec. 8, 2005    (JP)    ............................. 2005-355211

(51) Int. Cl.
    *H01L 29/778* (2006.01)
(52) U.S. Cl. ................ 257/340; 257/659; 257/E21.428
(58) Field of Classification Search ................. 257/194, 257/167, 659, 652, 340
    See application file for complete search history.

(56) References Cited

U.S. PATENT DOCUMENTS

| 6,504,190 B2 | 1/2003 | Haematsu |
| 7,250,643 B2 * | 7/2007 | Nishi .......................... 257/194 |
| 2001/0025966 A1 * | 10/2001 | Mizuhara ..................... 257/194 |
| 2002/0115303 A1 * | 8/2002 | Ohta et al. .................. 438/765 |
| 2005/0189559 A1 * | 9/2005 | Saito et al. .................. 257/189 |

FOREIGN PATENT DOCUMENTS

JP    2000-124227    4/2000

* cited by examiner

*Primary Examiner*—Jerome Jackson, Jr.
*Assistant Examiner*—Paul A Budd
(74) *Attorney, Agent, or Firm*—Leydig, Voit & Mayer, Ltd.

(57) ABSTRACT

A semiconductor device includes a substrate having a recess, a gate electrode in the recess in the substrate, and a source electrode and a drain electrode disposed on opposite sides of the gate electrode. An insulating film is on at least on a surface of the gate electrode and a portion in the recess, other than where the gate electrode is located, and a shield electrode connected to the source electrode is located on a portion of the insulating film between the gate electrode and the drain electrode.

9 Claims, 16 Drawing Sheets

SEMICONDUCTOR DEVICE WITH RECESSED GATE AND SHIELD ELECTRODE

BACKGROUND OF THE INVENTION

1. Field of the Invention

The present invention relates to a semiconductor device and a method of manufacturing the semiconductor device. More specifically, the present invention relates to a semiconductor device having a shield electrode connected to a source electrode and to a method of manufacturing the semiconductor device.

2. Background Art

As a conventional MOSFET effective in improving gain, a laterally diffused metal oxide semiconductor (LDMOS) for example is known. In the LDMOS, a source electrode is extended so as to cover a gate electrode. A Faraday shielding effect is thereby produced to achieve a reduction in gate-drain capacitance (Cgd) and, hence, an increase in gain.

Another structure for reducing the gate-drain capacitance is known in which a shield electrode is formed between a gate electrode and a drain electrode on a substrate with insulating film interposed between these electrodes. Also in this structure, the gate electrode and the drain electrode are separated by the shield electrode to reduce the gate-drain capacitance and to thereby improve the maximum stable gain (MSG).

A technique of forming a recess structure in an ion implanted portion of a cap layer and forming an offset gate electrode adjacent to this ion implanted portion has also been disclosed (see, for example, Japanese Patent Laid-Open No. 2000-124227). In this technique, the distance between the gate electrode and the drain electrode is increased to minimize the capacitance Cgd.

The gate-source capacitance (Cgs) is increased in a case where, as in the above-described conventional structure, a source electrode or a shield electrode connected to a source electrode is formed on a gate electrode with insulating film interposed therebetween. A semiconductor device having electrodes formed as described above is thought to have a deterioration in characteristics, e.g., an increase in noise factor (NF) when used in a low-noise amplifier. Therefore, an increase in gate-source capacitance accompanying a reduction in gate-drain capacitance is undesirable.

In a case where a T-gate electrode structure is used as a gate electrode, not only the capacitance between the gate electrode and the drain electrode but also the capacitance between the gate electrode and the semiconductor layer is an influential factor in determining the gate-drain capacitance. In the conventional art, however, it is difficult to reduce the capacitance between the gate electrode and the semiconductor layer since a source electrode or a shield electrode is laminated on the gate electrode.

SUMMARY OF THE INVENTION

In view of the above-described problem, an object of the present invention is to provide a semiconductor device improved so that the capacitance between a gate electrode and a drain electrode is reduced while the increase in the gate electrode and a source electrode is limited, and a method of manufacturing the semiconductor device.

According to one aspect of the present invention, a semiconductor device comprises a substrate having a recess, a gate electrode formed in the recess of the substrate, a source electrode, and a drain electrode. The source electrode and the drain electrode are disposed on opposite sides of the gate electrode. The semiconductor device further comprises an insulating film and a shield electrode. The insulating film is formed at least on a surface of the gate electrode and a portion in the recess other than the gate electrode formation portion. The shield electrode is formed on a portion of the insulating film between the gate electrode and the drain electrode and connected to the source electrode.

According to another aspect of the present invention, in a method of manufacturing a semiconductor device, a recess is formed in a surface of a substrate. A gate electrode is formed in the recess. A source electrode and a drain electrode are formed on opposite sides of the gate electrode. A first insulating film is formed on the gate electrode, the source electrode, the drain electrode and an exposed surface in the recess. A shield electrode is formed on a portion of the first insulating film between the gate electrode and the drain electrode.

Other and further objects, features and advantages of the invention will appear more fully from the following description.

DESCRIPTION OF THE PREFERRED EMBODIMENT

Figure 1:
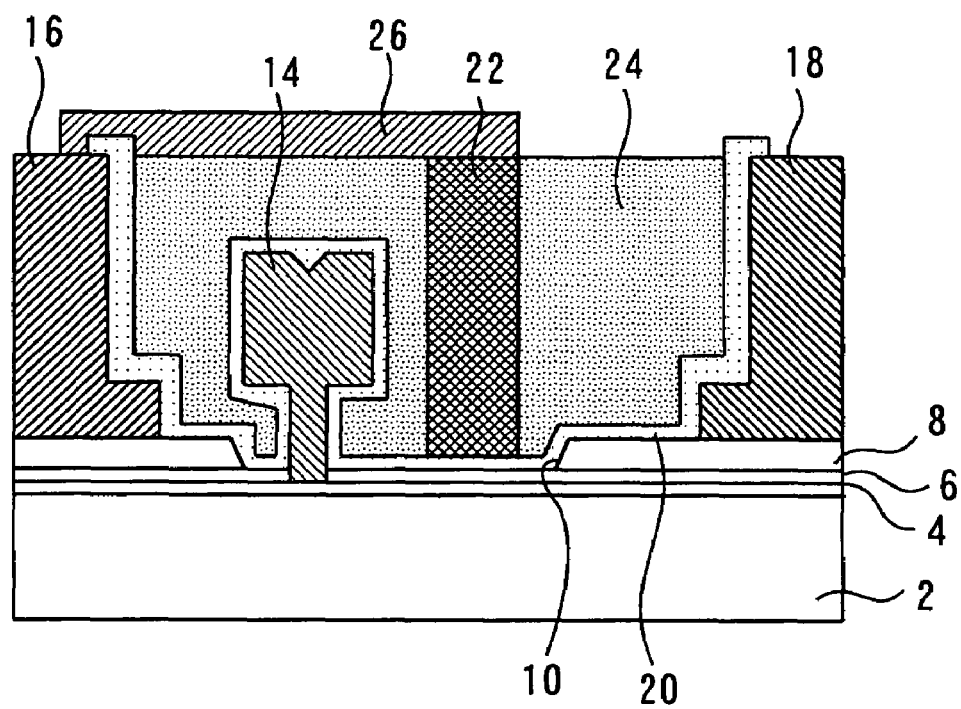
FIG. 1 is a schematic sectional view of a semiconductor device in a first embodiment of the present invention.

Embodiments of the present invention will be described with reference to the accompanying drawings. In the accompanying drawings, portions identical or corresponding to each other are indicated by the same reference characters. The description of the identical or corresponding portions will be made so as to reduce or avoid redundancy of description.

A mention made of any of numeric values representing the numbers, amounts, ranges, and so on of elements in the following description of the embodiments is not to be construed as limitation to the mentioned numeric value unless it is made for a particular specification or unless it is apparent that the numeric value is apparently determined theoretically. Also, each of structures, steps in methods, and so on described in the descriptions of the embodiments is not indispensable to the present invention unless it is described for a particular specification or unless it is apparent that it is theoretically determined.

First Embodiment

FIG. 1 is a schematic sectional view of a semiconductor device in a first embodiment of the present invention, showing a section as seen in the gate longitudinal direction. The semiconductor device shown in FIG. 1 has a semiconductor substrate 2. The semiconductor substrate 2 is a GsAs substrate on which an isolation region or the like (not shown) is formed at required positions. In a region sectioned by the isolation region (not shown), an epitaxial crystal growth layers 4, 6, and 8 are laid one on another. The epitaxial crystal growth layer 4 is, for example, an AlGaAs layer. The epitaxial crystal growth layer 6 is, for example, a GaAs layer. The epitaxial crystal growth layer 8 is, for example, a high-concentration GaAs layer. A recess 10 is formed in the epitaxial crystal growth layer 8. A T-gate electrode 14 is formed on the epitaxial crystal growth layer 4 in the recess 10. That is, the gate electrode 14 has such a shape as to have a portion of a smaller gate length, as viewed in the sectional view of FIG. 1, at a position at which it contacts the epitaxial crystal growth layer 4, and another portion of a longer gate length above the portion having the smaller gate length. As shown in the sectional view of FIG. 1, a source electrode 16 and a drain electrode 18 are formed with the gate electrode 14 interposed therebetween. That is, the source electrode 16 and the drain electrode 18 are formed on the epitaxial crystal growth layer 8 outside the recess 10, with the recess 10 interposed therebetween.

An insulating film 20 (corresponding to the insulating film and the first insulating film in the present invention) is formed on surface of the gate electrode 14, the side surfaces of the source electrode 16 and the drain electrode 18, a portion of the epitaxial crystal growth layer 8 on which no electrode (14, 16, 18) is formed, and a portion of the epitaxial crystal growth layer 6 on which the epitaxial crystal growth layer 8 is not formed. A shield electrode 22 is formed on the insulating film 20 formed in the recess 10 between the gate electrode 14 and the drain electrode 18. A low-dielectric-constant organic film (hereinafter referred to as "low-k film") 24 is formed on the substrate. The gate electrode 14, source electrode 16, drain electrode 18 and shield electrode 22 formed as described above are embedded in the low-k film 24. A piece of wiring 26 which connects the surface of the source electrode 16 and the surface of the shield electrode 22 is formed on the low-k film 24.

Conventional semiconductor devices have a structure in which a gate electrode is covered with a shield electrode (or a source electrode) to reduce the gate-drain capacitance. In such a structure, only an insulating film is formed between the shield electrode and the gate electrode, and the gate-source capacitance is determined by the dielectric constant of the insulating film formed therebetween. Therefore the gate-source capacitance is increased while the gate-drain capacitance is reduced. In contrast, in the semiconductor device shown in FIG. 1, a certain gap is formed in a region between the shield electrode 22 and the gate electrode 14. Therefore the gate-source capacitance is reduced. Thus, the provision of the shield electrode 22 in the structure of this embodiment ensures that the gate-drain capacitance can be reduced to achieve an improvement in gain while the increase in the gate-source capacitance is limited.

Figure 2:
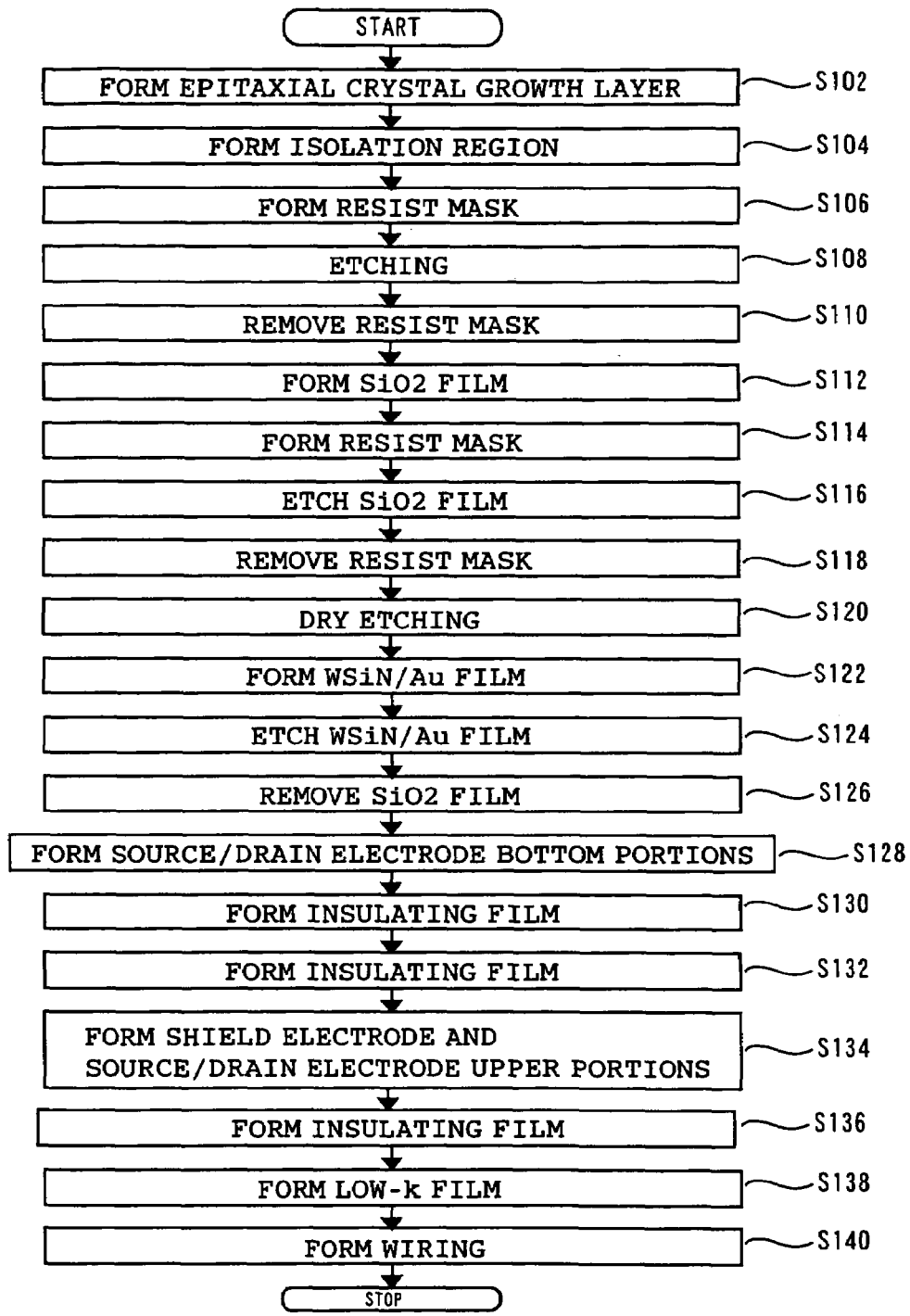
FIG. 2 is a flowchart for explaining a method of manufacturing the semiconductor device in the first embodiment.

FIG. 2 is a flowchart for explaining a method of manufacturing the semiconductor device in the first embodiment of the present invention. FIGS. 3 to 8 are schematic sectional views corresponding to FIG. 1, showing states in the process of manufacturing the semiconductor device. In the manufacturing process shown in the flowchart of FIG. 2, epitaxial crystal growth layers 4, 6, and 8 are first formed on the semiconductor substrate 2 (step S102). More specifically, an AlGaAs layer, a GaAs layer and a high-concentration GaAs layer are laid one on another as epitaxial crystal growth layers 4, 6, and 8. Subsequently, an isolation region (not shown) is formed (step S104).

Figure 3:
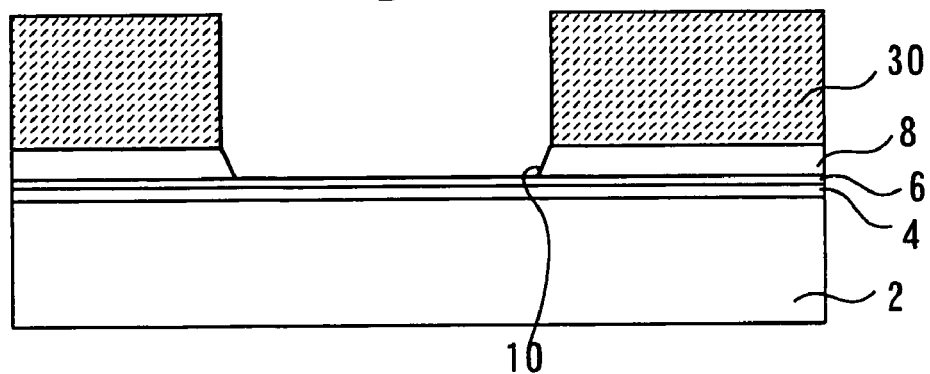
FIGS. 3 to 8 are schematic sectional views corresponding to FIG. 1, showing states in the process of manufacturing the semiconductor device in the first embodiment.

Referring then to FIG. 3, a resist mask 30 to be opened at the recess 10 formation position is formed (step S106). The resist mask 30 is formed by applying a resist on the epitaxial crystal growth layer 8 and an opening is formed at the position for the formation of the recess 10 by a photolithography technique. Subsequently, the epitaxial crystal growth layer 8 is etched with the resist mask 30 used as an etching mask (step S108). Recess 10 is thereby formed in the epitaxial crystal growth layer 8. Thereafter, the resist mask 30, which is no longer necessary, is removed (step S110).

Figure 4:
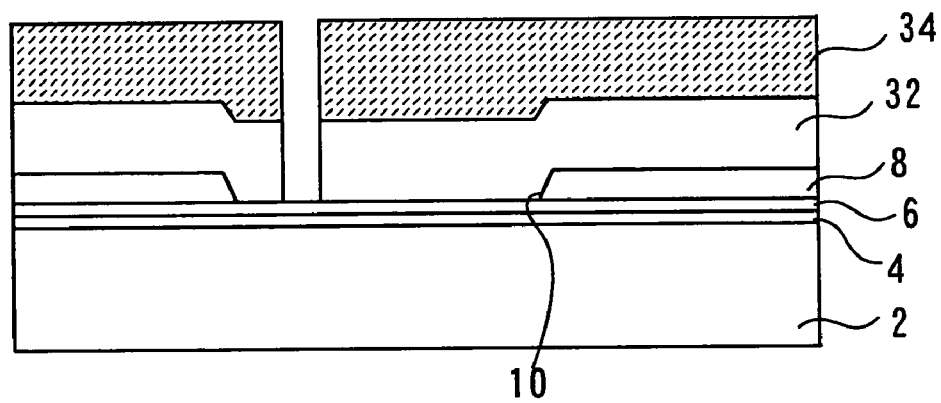

Referring next to FIG. 4, $SiO_2$ film 32 is formed on the substrate (step S112). A resist mask 34 is formed on the $SiO_2$ film 32 (step S114). The resist mask 34 has an opening corresponding to the lower shorter-gate-length portion of the gate electrode 14. The resist mask 34 is formed by using a photolithography technique or the like, as is the mask in the above-described step 106. Subsequently, the $SiO_2$ film 32 is etched with the resist mask 34 used as an etching mask (step S116).

Figure 5:
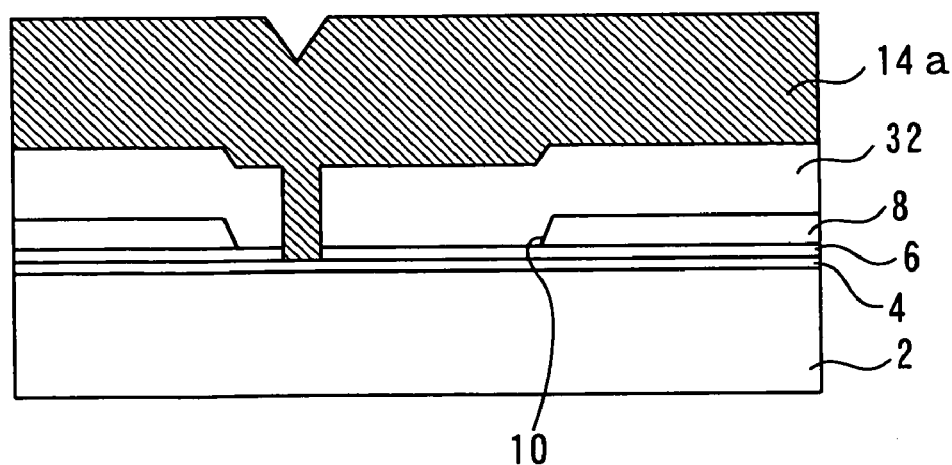

Referring next to FIG. 5, the resist mask is removed (step S118) and the epitaxial crystal growth layer 6 is selectively dry-etched (step S120). Dry etching of the epitaxial crystal growth layer 6 is performed under such a condition that etching selectivity between the $SiO_2$ film 32 and the epitaxial crystal growth layer 4 is sufficiently high. Subsequently, WSiN is sputtered onto the exposed portion of the surface of the epitaxial crystal growth layer 6 and onto the $SiO_2$ film 32 is formed and Au is further sputtered, thereby forming a WSiN/Au film 14a (step S122). The WSiN/Au film 14a is a film of the material forming the gate electrode 14.

Figure 6:
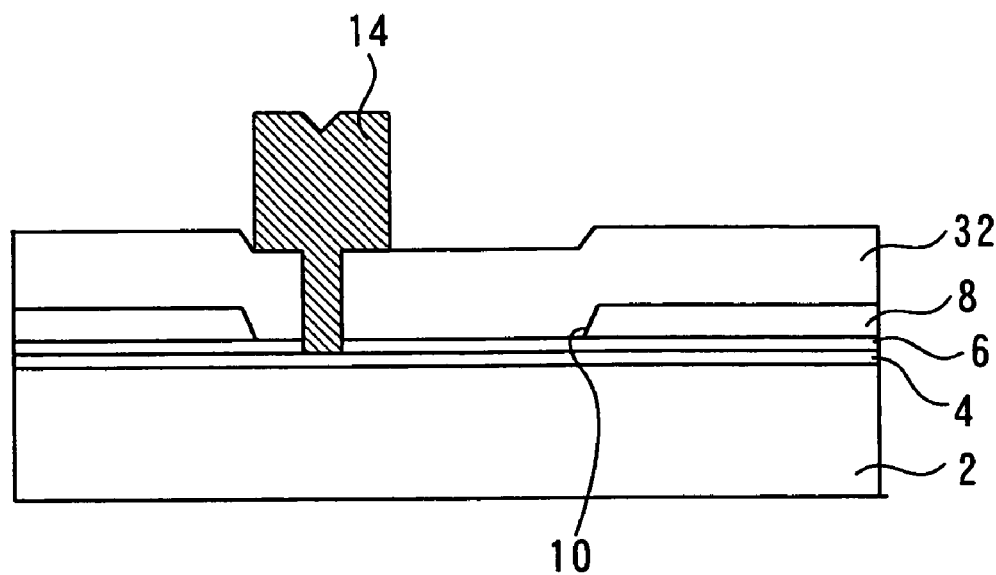

Referring next of FIG. 6, the WSiN/Au film 14a is etched to remove the unnecessary portion (step S124). T-gate electrode 14 is thereby formed. Thereafter, the side wall formed of $SiO_2$ film 32 is removed (step S126).

Figure 7:
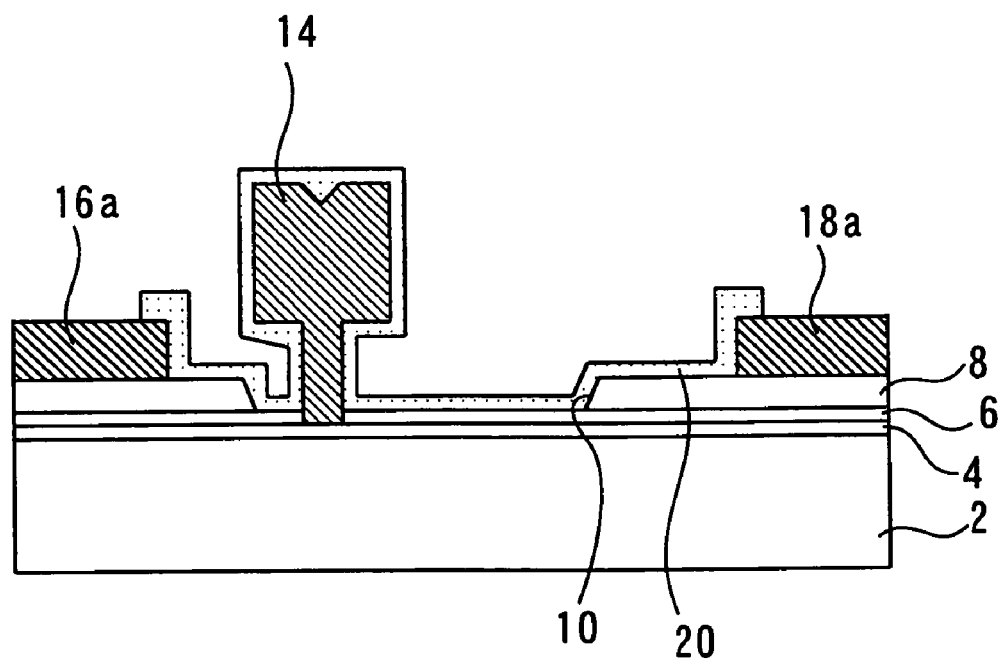

Referring next to FIG. 7, a bottom portion 16a of the source electrode 16 and a bottom portion 18a of the drain electrode 18 are formed (step S128). The source electrode bottom portion 16a and the drain electrode bottom portion 18a are formed by forming a photoresist mask having openings corresponding to places where the source electrode bottom portion 16a and the drain electrode bottom portion 18a will be formed, filling the openings with a metal film constituting the source electrode 16 and the drain electrode 18, and thereafter removing unnecessary portions of the metal film and photoresist mask. Subsequently, insulating film 20 is formed over the entire exposed portion on the substrate (step S130). Thereafter, insulating film 20 on the upper surfaces of the source electrode bottom portion 16a and the drain electrode bottom portion 18a is removed (step S132).

Figure 8:
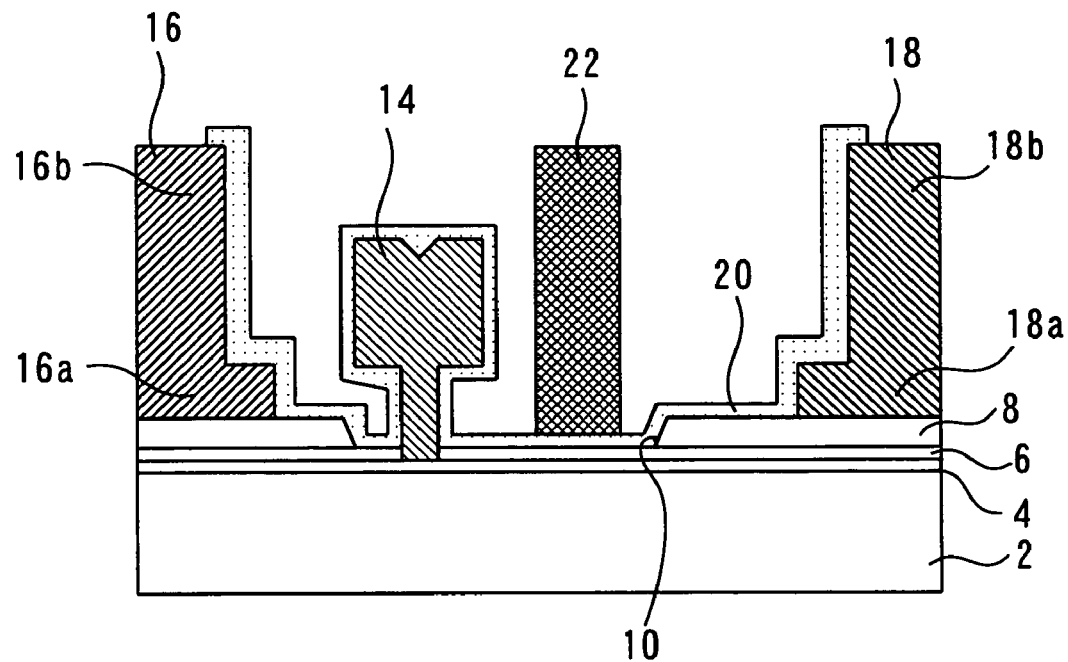

Referring next to FIG. 8, the shield electrode 22, an upper portion 16b of the source electrode 16, and an upper portion 18b of the drain electrode 18 are simultaneously formed (step S134). The shield electrode 22 is formed on the insulating film 20 in the recess 10 and between the gate electrode 14 and the drain electrode 18. The source electrode upper portion 16b and the drain electrode upper portion 18b are respectively formed on portions of the upper surfaces of the source electrode bottom portion 16a and the drain electrode bottom portion 18b from which the insulating film 20 has been removed. The shield electrode 22 is formed by forming a photoresist mask having an opening corresponding to a place where the shield electrode 22 will be formed, filling the opening with the metal film constituting the source electrode upper portion 16b, the drain electrode upper portion 18b and the shield electrode 22, and thereafter removing an unnecessary portion of the metal film and photoresist mask. Thereafter, the insulating film is formed on side surfaces of the source electrode upper portion 16b and the drain electrode upper portion 18b (step S136).

Subsequently, low-k film 24 is formed so that the gate electrode 14, the source electrode 16, the drain electrode 18 and the shield electrode 22 are embedded therein, followed by flattening (step S138). A piece of wiring 26 is thereafter formed to connect the source electrode 16 and the shield electrode 22 (step S140). More specifically, the piece of wiring 26 is formed by masking with a photoresist the portion where the piece of wiring 26 is not formed and thereafter performing plating. The semiconductor device shown in FIG. 1 is thus formed.

In the first embodiment, as described above, the shield electrode 22 is formed so that a certain gap is provided between the shield electrode 22 and the gate electrode 14. Thus, the gate-drain capacitance can be reduced while the increase in the gate-source capacitance is limited.

The method described above with reference to the flowchart of FIG. 2 is not necessarily limiting of the present invention. In the present invention, each step may be executed by a different method if the shield electrode 22 is formed on the insulating film 20 in the recess 10 and between the gate electrode 14 and the drain electrode 18.

The first embodiment has been described with respect to a case where the gate electrode 14 is a T-gate electrode. If the gate electrode 14 is formed of a T-type electrode as described above, a sufficiently large gate length and a reduction in resistance can be ensured even in a semiconductor device in accordance with a finer design rule. However, the present invention is not limited to the T-gate electrode. The present invention can be applied to semiconductor devices having gates in other shapes. Also, the shapes of other portions including the source electrode 16 and the drain electrode 18 may be provided in other shapes instead of being provided only in those shown in FIG. 1.

The "recess forming step" of the present invention is embodied by executing steps S106, S108 and S110 in the manufacturing process shown in FIG. 2; the "gate electrode forming step" of the present invention by executing steps S112, S124, and S126; the "source/drain forming step" of the present invention by executing step S128; and the "shield electrode forming step" of the present invention by executing step S134.

Second Embodiment

Figure 9:
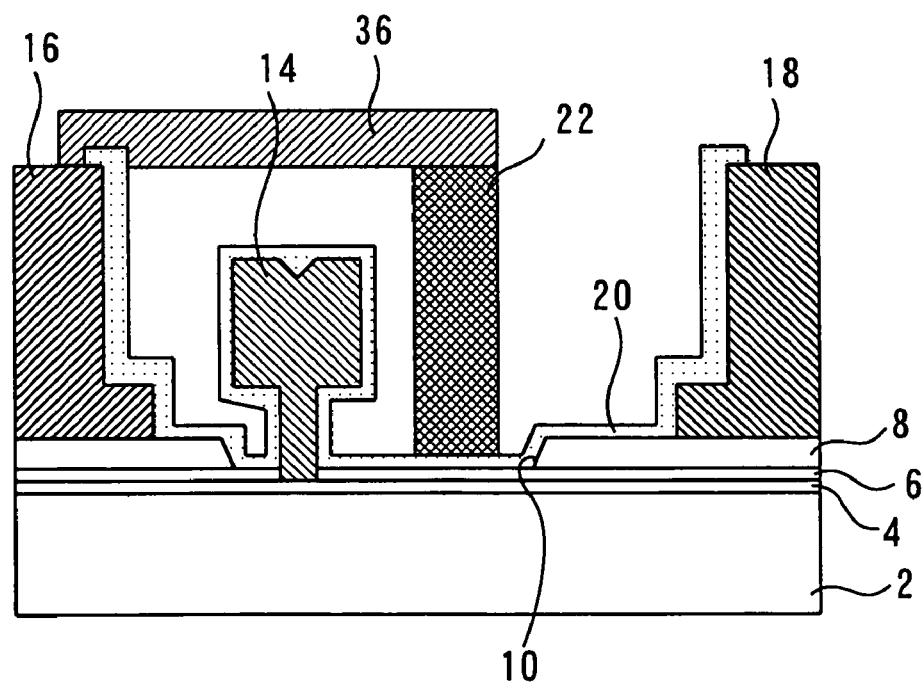
FIG. 9 is a schematic diagram for explaining a semiconductor device in a second embodiment of the present invention.

FIG. 9 is a schematic diagram for explaining a semiconductor device in a second embodiment of the present invention. The semiconductor device shown in FIG. 9 is the same as that shown in FIG. 1 except that the low-k film 24 filling the space between the source electrode 16 and the shield electrode is not provided, and that air bridge wiring 36 is provided in place of wiring 26 of the semiconductor device shown in FIG. 1.

More specifically, a piece of air bridge wiring 36 is formed so as to connect the upper surface of the shield electrode 22 and the upper surface of the source electrode 16 in the semiconductor device shown in FIG. 9. Atmospheric air occupies the region surrounded by the piece of air bridge wiring 36, the shield electrode 22 and the source electrode 16. This structure ensures a reduction in parasitic capacitance and a reduction in gate-source capacitance since the insulating film (e.g., low-k film 24) between the gate electrode 14 and the shield electrode 22 is removed. That is, the gate-drain capacitance can be reduced while the increase in the gate-source capacitance is limited, thus realizing an improvement in gain of the semiconductor device.

Figure 10:
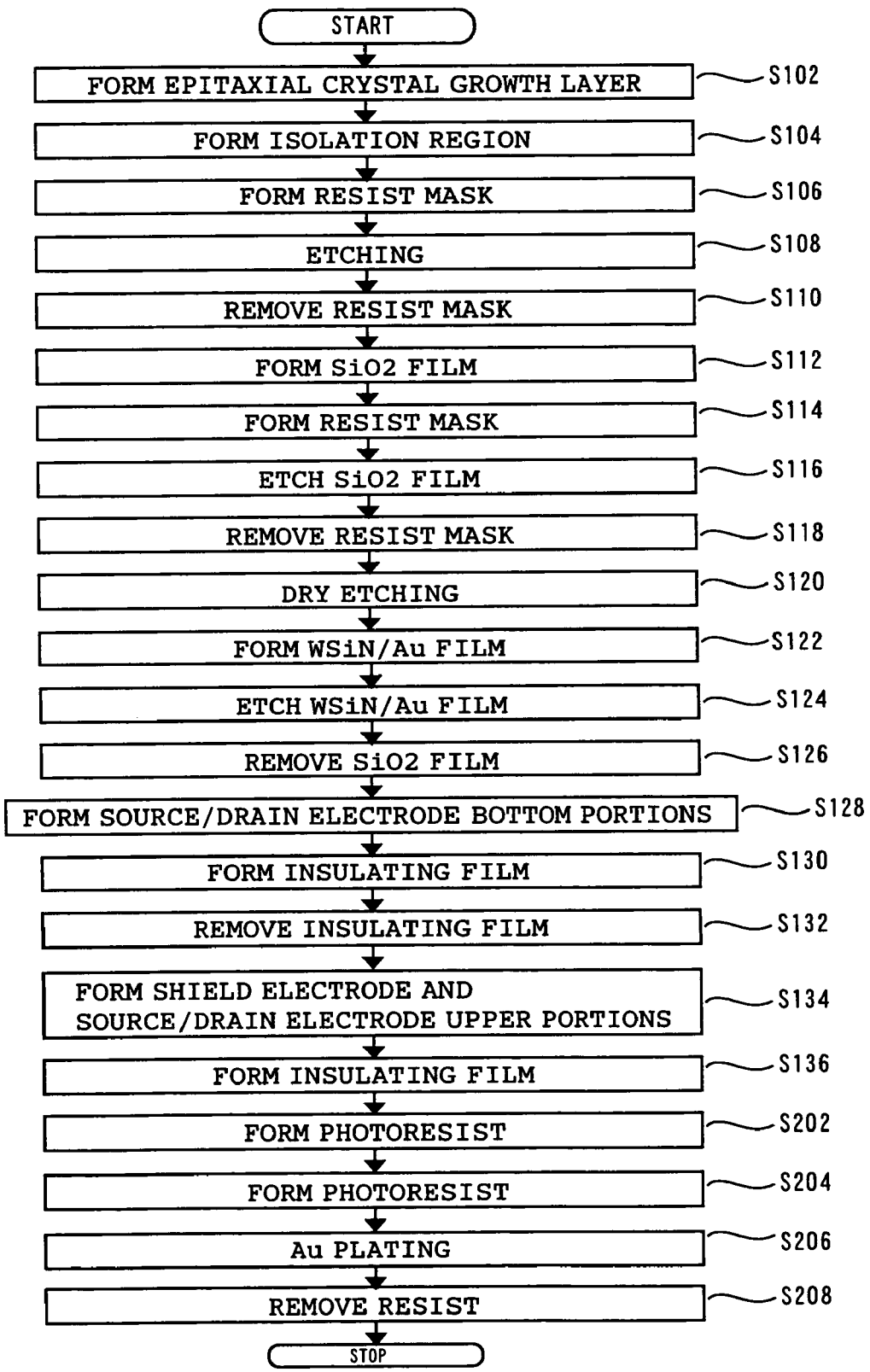
FIG. 10 is a flowchart for explaining a method of manufacturing the semiconductor device in the second embodiment.
Figure 11:
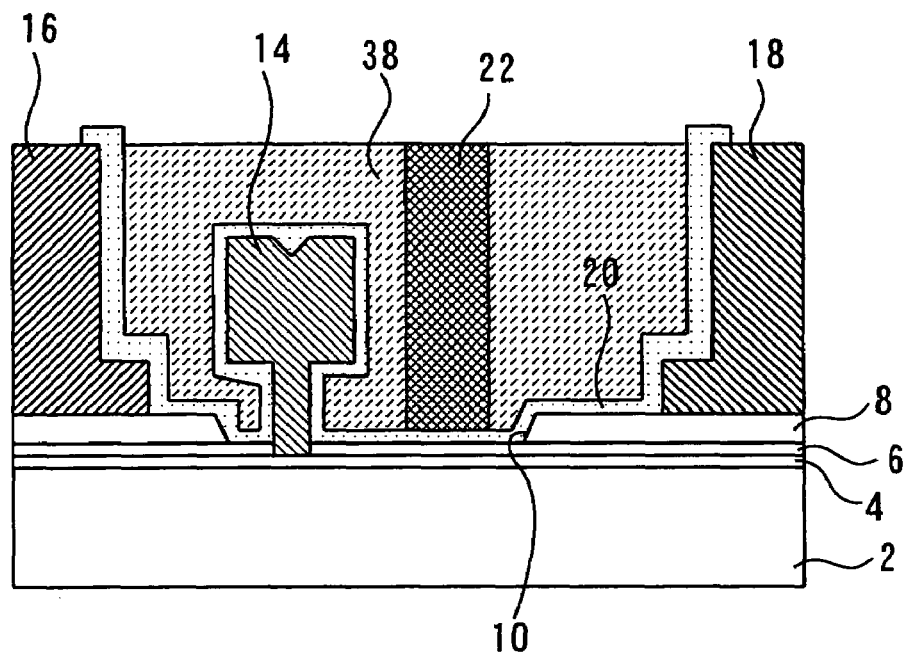
FIGS. 11 and 12 are schematic diagrams showing states in the process of manufacturing the semiconductor device in the second embodiment.
Figure 12:
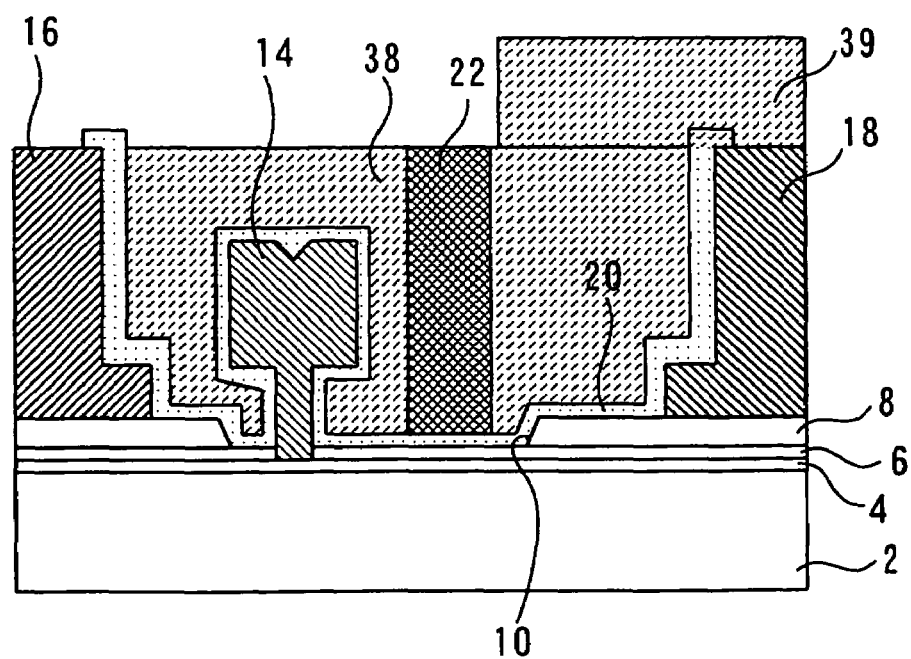

FIG. 10 is a flowchart for explaining a method of manufacturing the semiconductor device in the second embodiment. FIGS. 11 and 12 are schematic diagrams showing states in the process of manufacturing the semiconductor device in the second embodiment. The manufacturing processing shown in FIG. 10 is the same as the manufacturing process shown in FIG. 2 except that steps S202, S204, S206, and S208 are executed in place of steps S138 and S140 of the manufacturing process shown in FIG. 2. More specifically, after the formation of gate electrode 14, source electrode 16 and drain electrode 18, the formation of insulating film 20 and the formation of shield electrode 22 by steps S102 to S136, a resist 38 (corresponding to the first resist in the present invention) is formed on the substrate so that source electrode 16, gate electrode 14, shield electrode 22 and drain electrode 18 are embedded therein (step S202), as shown in FIG. 11. At this time, an upper portion of the source electrode 16 and an upper portion of the shield electrode 22 are exposed in the surface of the resist 38.

As shown in FIG. 12, the portion of the surface of the resist 38 on which no piece of air bridge wiring 36 will be formed is masked with a photoresist 39 (step S204), and Au plating is performed (step S206). Au film is thereby formed on the portion on which no photoresist mask 39 is formed and on the surface of the photoresist mask 39. The resist 38, the photoresist mask 39 and Au film on the surface of the photoresist mask 39 are thereafter removed (step S208). Air bridge wiring 36 is thus formed.

The air bridge wiring forming method in the present invention is not limited to the process described as steps S202, S204, S206, and S208. In the present invention, the air bridge wiring may be formed by any other method if the insulating film (e.g., low-k film 24) in the portion defined by the shield electrode 22, the source electrode 16 and the air bridge wiring 36 is removed to form a space.

In the second embodiment, the "first resist forming step" is embodied by executing step S202; the "air bridge wiring forming step" by executing step S206; and the "first resist removal step" by executing step S208.

Third Embodiment

Figure 13:
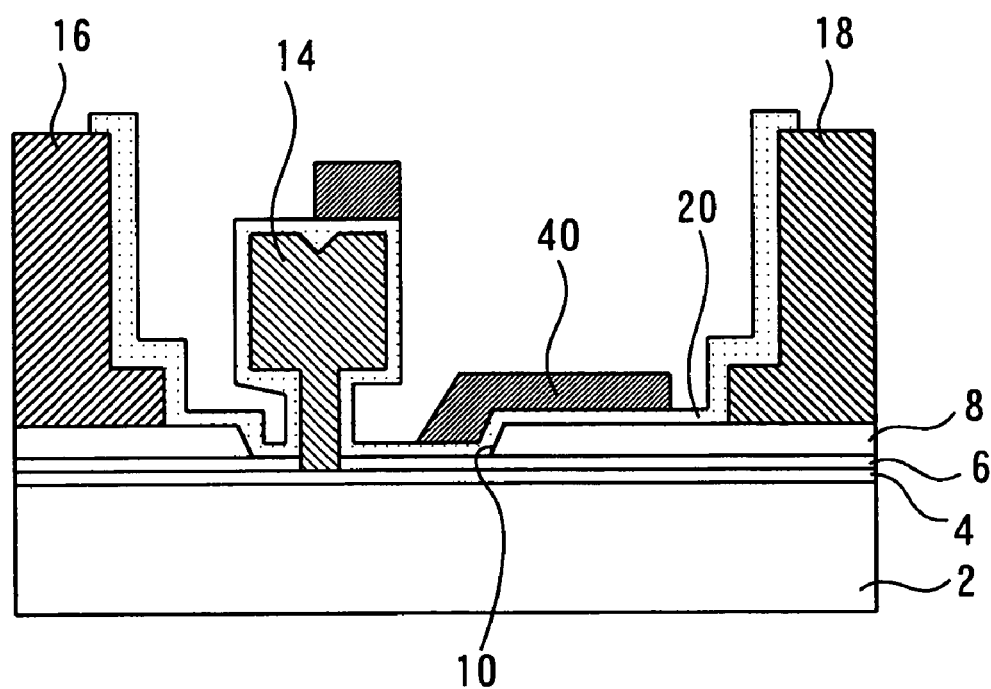
FIG. 13 is a schematic diagram for explaining a semiconductor device in a third embodiment of the present invention.

FIG. 13 is a schematic diagram for explaining a semiconductor device in a third embodiment of the present invention. The semiconductor device shown in FIG. 13 is the same as that shown in FIG. 1 except that a shield electrode 40 is provided in place of the shield electrode 22 of the semiconductor device shown in FIG. 1. More specifically, in the semiconductor device shown in FIG. 13, the shield electrode 40 is formed so as to extend from a position on the insulating film 20 in the recess 10 between the gate electrode 14 and the drain electrode 18 and immediately below the side surface of the gate electrode 14 on the drain electrode 18 side to a position closer to the drain electrode 18.

The shield electrode 40 is formed on a portion of the gate electrode 14 on the drain electrode 18 side and opposite from a portion facing the semiconductor substrate 2 in the longer-gate-length portion of the gate electrode 14 (hereinafter referred to as "projecting portion 14a"), thereby achieving reliable shielding between the projecting portion 14a of the gate electrode 14 on the drain electrode 18 side and the epitaxial crystal growth layer (high-concentration GaAs layer) 8 on the drain side and between the projecting portion 14a and the non-depleted channel region on the drain side. That is, lines of electric force running between the gate electrode 14 and the epitaxial crystal growth layer 8 on the drain side and the non-depleted channel region on the drain side can be blocked with reliability, thus enabling the gate-drain capacitance to be reduced.

Figure 14:
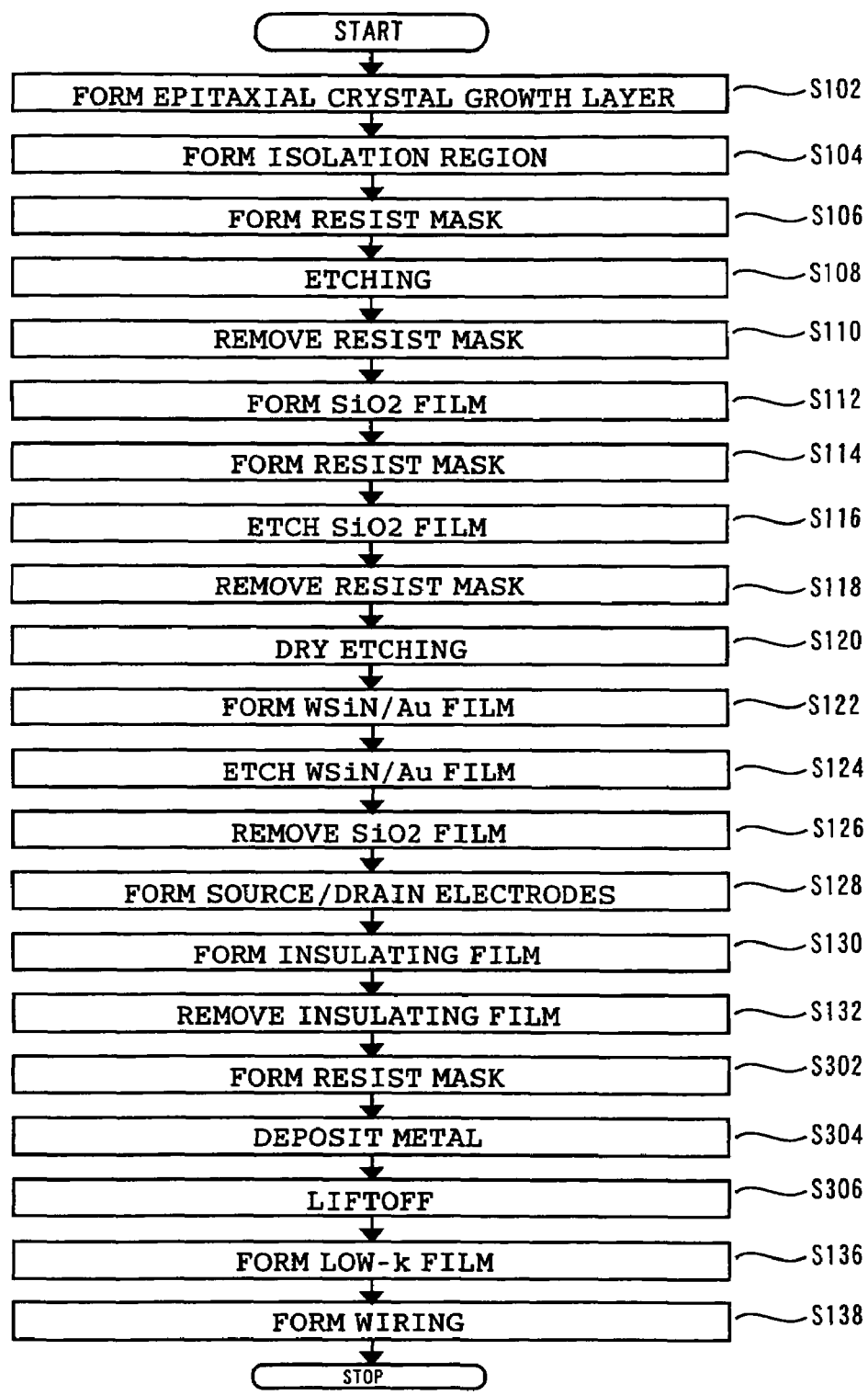
FIG. 14 is a flowchart for explaining a method of manufacturing the semiconductor device in the third embodiment.
Figure 15:
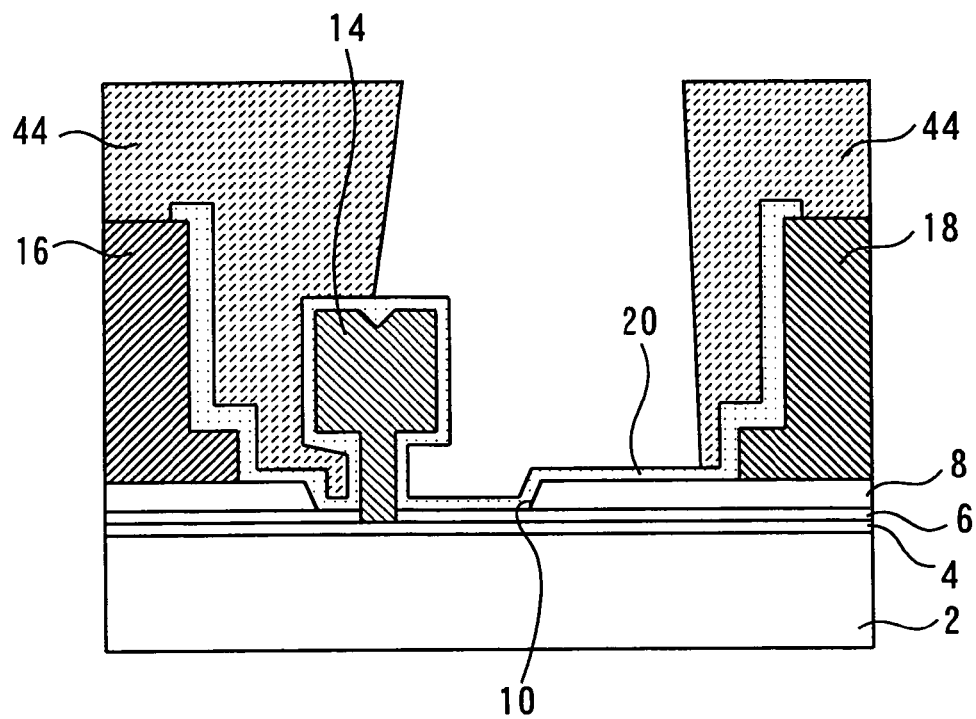
FIGS. 15 and 16 are schematic diagrams showing states in the process of manufacturing the semiconductor device in the third embodiment.
Figure 16:
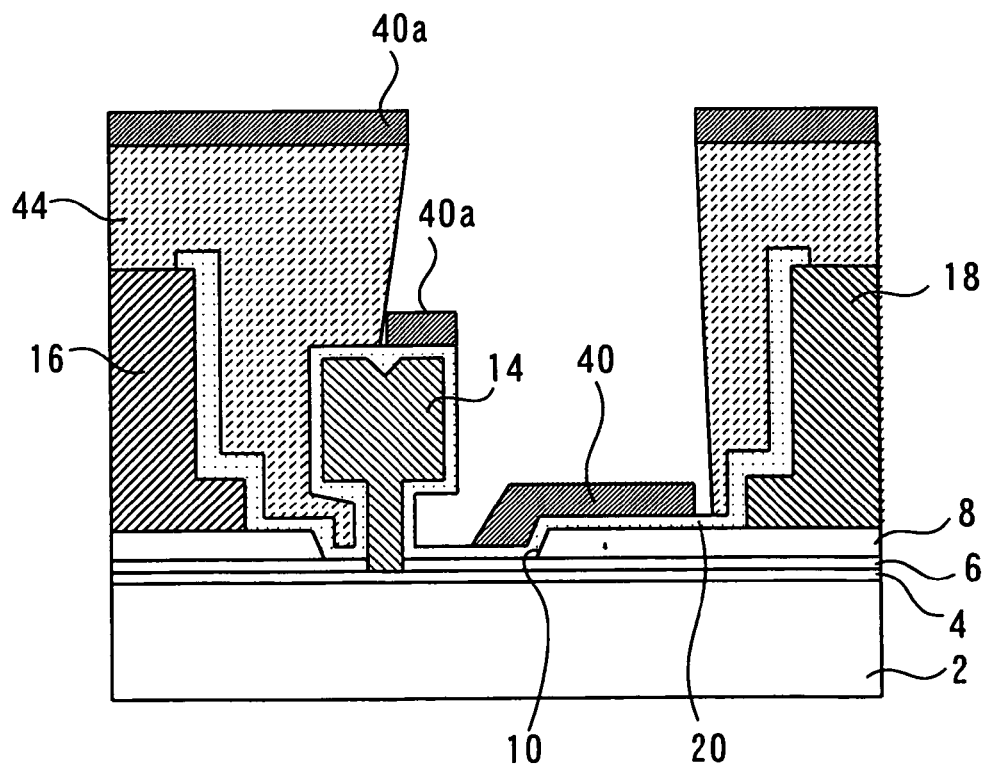

FIG. 14 is a flowchart for explaining a method of manufacturing the semiconductor device in the third embodiment of the present invention. FIGS. 15 and 16 are schematic diagrams showing states in the process of manufacturing the semiconductor device in the third embodiment. FIGS. 15 and 16 are sectional views corresponding to FIG. 13. The manufacturing processing shown in FIG. 14 is the same as the manufacturing process shown in FIG. 2 except that steps S302, S304, and S306 are executed in place of step S134 of the manufacturing process shown in FIG. 2. More specifically, the gate electrode 14, the source electrode 16 and the drain electrode 18 are formed by steps S102 to S132. In step S128, however, the source electrode upper portion 16b and the drain electrode upper portion 18b are successively formed after the formation of the source electrode bottom portion 16a and the drain electrode bottom portion 18a. Thereafter, insulating film 20 which covers the entire surface of the gate electrode 14 and the side surfaces of the source electrode 16 and the drain electrode 18 is formed.

Subsequently, as shown in FIG. 15, a resist mask 44 having an opening in which the shield electrode 40 will be formed is formed (step S302). Subsequently, as shown in FIG. 16, a metal 40a constituting the shield electrode 40 is deposited on the entire exposed portion of the substrate surface (step S304). Unnecessary metal 40a portions formed on the resist mask 44 are removed together with the resist mask 44 by a deposition liftoff method (step S306). Thus, the semiconductor device having the shield electrode 40 is formed, as shown in FIG. 13. Metal 40a on the gate electrode 14 remains after this process without being removed.

Low-k film 24 is thereafter formed in the same manner as in the first embodiment and a piece of wiring for electrically connecting the source electrode 16 and the shield electrode 40 is formed (steps S136 and S138). A piece of air bridge wiring for connecting the source electrode 16 and the shield electrode 40 may alternatively be formed, as in the second embodiment.

In the third embodiment, as described above, the shield electrode 40 is formed between the projecting portion 14a of the gate electrode 14 and the epitaxial crystal growth layer 8 on the drain side to reduce the gate-drain capacitance. To form the shield electrode 40, a technique in which metal 40a is deposited by using the gate electrode 14 as a mask and unnecessary metal 40a portions are removed by a deposition liftoff method. Therefore the shield electrode 40 can be formed by the side of the projecting portion 14a of the gate electrode 14 without any deviation from the correct position to block electric force lines with improved reliability.

The third embodiment has been described with respect to a case where metal 40a is deposited by using the resist mask 44 and the gate electrode 14 as a mask and unnecessary portions are removed. However, this method of forming the shield electrode 40 is not exclusively used in this embodiment. Any other method may be used to form the shield electrode 40 on the projecting portion 14a of the gate electrode 14.

In the third embodiment, each of the "second resist forming step" and the "second resist opening step" of the present invention is embodied by executing step S302; the "metal deposition step" of the present invention by executing step S304; and the "liftoff step" of the present invention is implemented by executing step S306.

Fourth Embodiment

Figure 17:
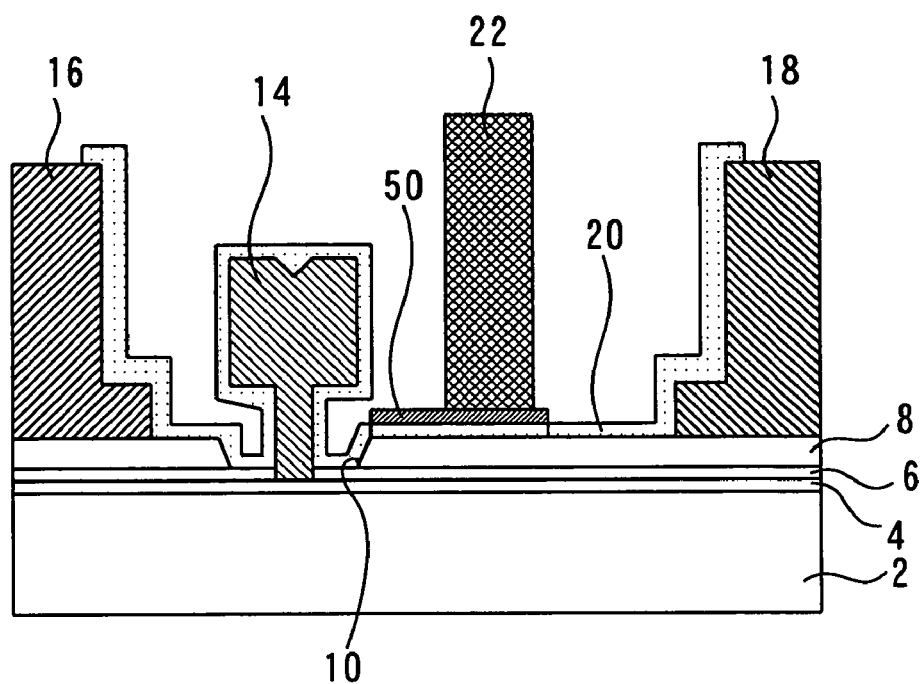
FIG. 17 is a schematic diagram for explaining a semiconductor device in a fourth embodiment of the present invention.

FIG. 17 is a schematic diagram for explaining a semiconductor device in a fourth embodiment of the present invention. The semiconductor device shown in FIG. 17 is the same as that shown in FIG. 1 except that a shield extension 50 (corresponding to "metal film" of the present invention) is provided below the shield electrode 22. More specifically, in the semiconductor device shown in FIG. 17, the shield extension 50 is formed so as to extend from a position between the projecting portion 14a of the gate electrode 14 on the drain electrode 18 side and the epitaxial crystal growth layer 8 on the drain side to a position closer to the portion under the shield electrode 22. The shield extension 50 is an electroconductive portion made of a metal.

As described above, the shield extension 50 is provided between the projecting portion 14a and the epitaxial crystal growth layer 8 on the drain side to reliably block electric force lines between the gate electrode 14 and the epitaxial crystal growth layer (high-concentration GaAs layer) 8 on the drain side and the non-depleted channel region on the drain side and to reduce the capacitance value.

Figure 18:
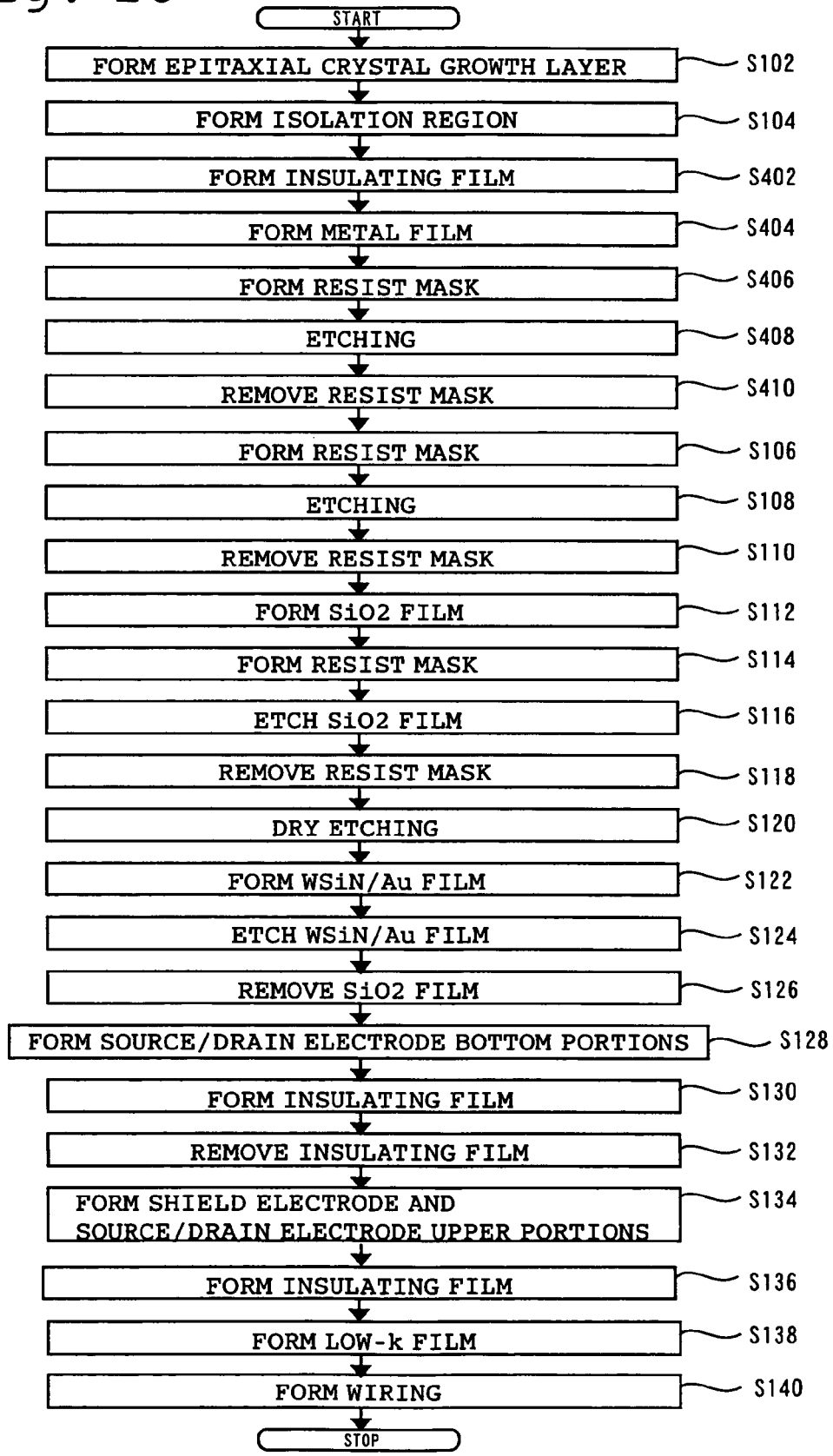
FIG. 18 is a flowchart for explaining a method of manufacturing the semiconductor device in the fourth embodiment.

FIG. 18 is a flowchart for explaining a method of manufacturing the semiconductor device in the fourth embodiment of the present invention. FIGS. 19 to 23 are schematic diagrams showing states in the process of manufacturing the semiconductor device in the fourth embodiment. The manufacturing processing shown in FIG. 18 is the same as the manufacturing process shown in FIG. 2 except that steps S402, S404, S406, S408, and S410 subsequent to step S104 are provided.

Figure 19:
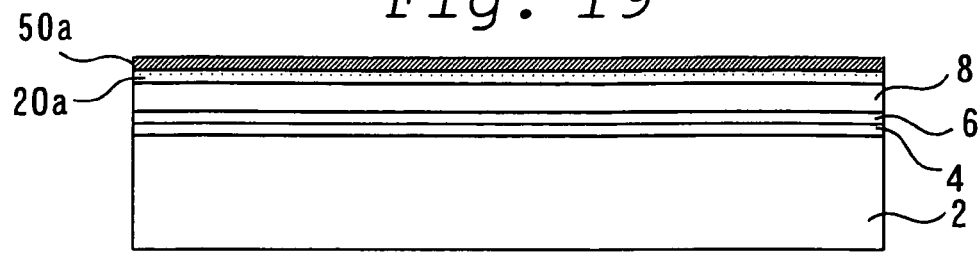
FIGS. 19 to 23 are schematic diagrams showing states in the process of manufacturing the semiconductor device in the fourth embodiment.

More specifically, referring to FIG. 19, insulating film 20a is formed (step S402) on the substrate on which the epitaxial crystal growth layers 4, 6, and 8 and the isolation region (not shown) have been formed, and metal film 50a constituting the shield extension 50 is laid on the insulating film 20a (step S404).

Figure 20:
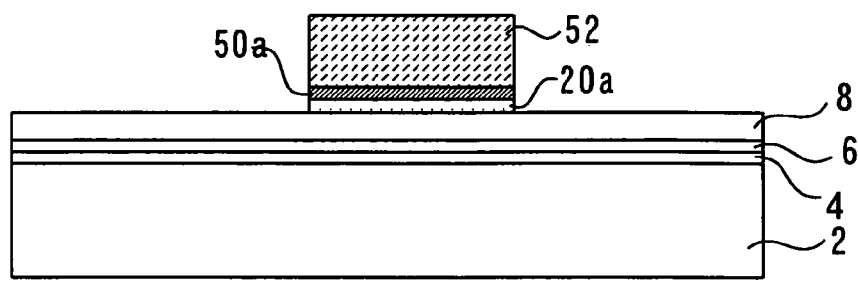

Referring to FIG. 20, a photoresist mask 52 is formed (step S406) so as to cover the place where the shield extension 50 will be formed and a portion of the place where the recess 10 will be formed. The metal film 50a and the insulating film 20a are etched with the resist mask 52 used as an etching mask (step S408). The unnecessary photoresist mask 52 is thereafter removed (step S410).

Figure 21:
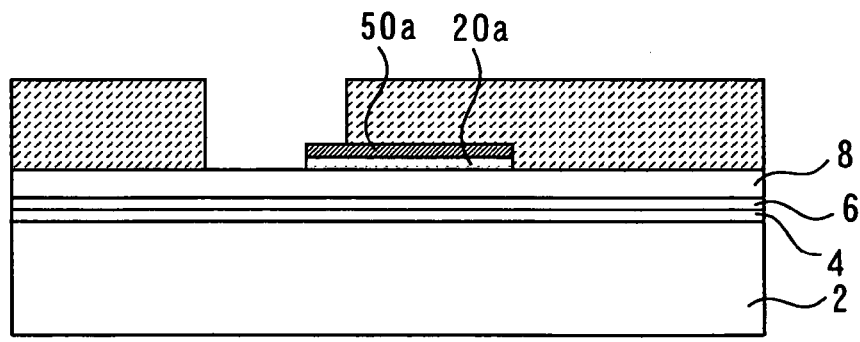

Referring to FIG. 21, a resist mask 30 is formed in alignment with the place where the recess 10 will be formed, as in step S106 in the first embodiment. At this time, the surface of the portion of the metal film 50a formed so as to extend to the portion of the recess 10 formation place is exposed without being covered with the resist mask 30.

Figure 22:
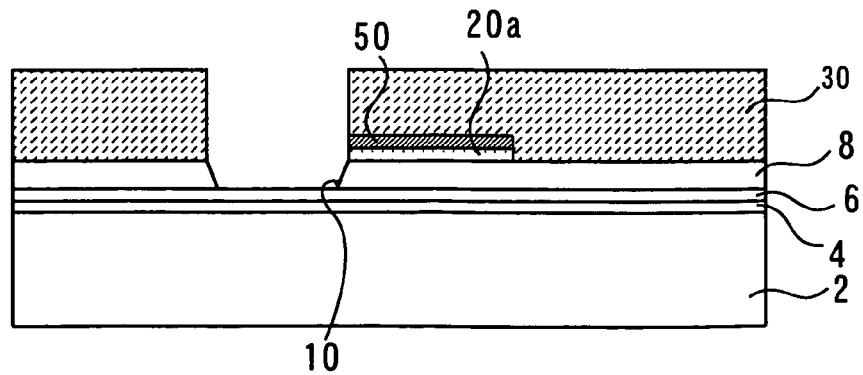

Referring to FIG. 22, in step S108, the metal film 50a, the insulting film 20a and the epitaxial crystal growth layer 8 are etched with the resist mask 30 used as an etching mask. At this time, the unnecessary portions of the metal film 50a and the insulating film 20a formed by being extended on the recess 10 side are etched. The epitaxial crystal growth layer 8 is also etched. The recess 10 is thereby formed (step S108). Thereafter, the resist mask 30 is removed (step S110).

Figure 23:
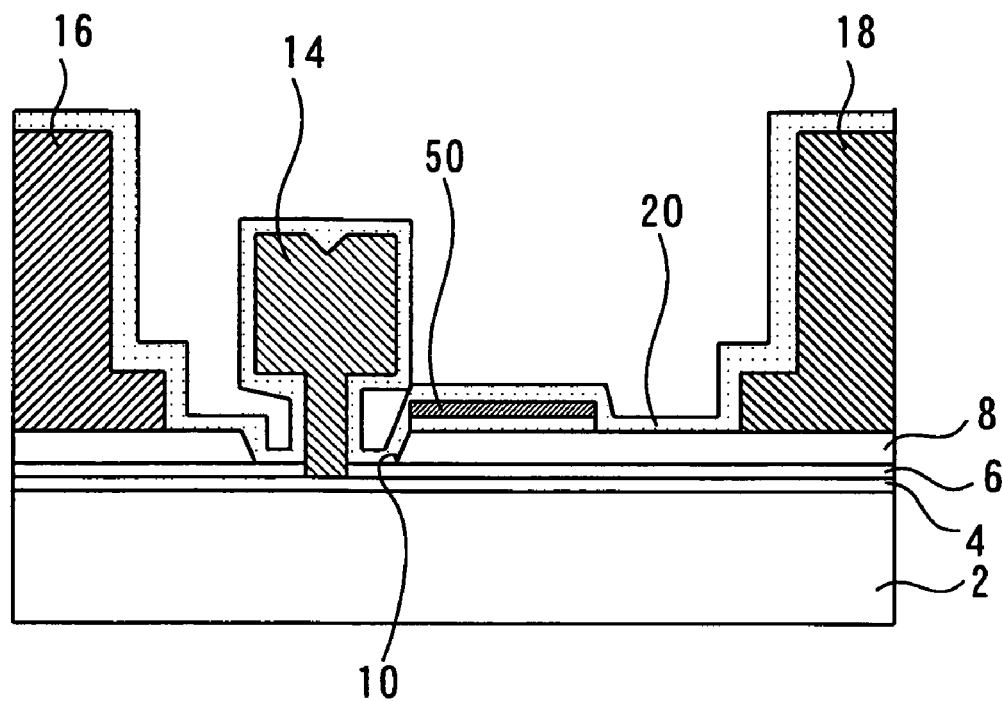

Referring to FIG. 23, steps S112 to S128 shown in FIG. 2 are also executed to form the gate electrode 14, the source electrode 16 and the drain electrode 18 on the substrate. Subsequently, insulating film 20 is formed in step S130. When the insulating film 20 on the source electrode 16 and the drain electrode 18 is thereafter removed in step S132, the insulating film 20 formed on the shield extension 50 is simultaneously removed.

In step S134, the shield electrode 22 is formed on the shield extension 50. The semiconductor device shown in FIG. 17 is thus formed. Thereafter, the steps of filling with low-k film 24 and forming a piece of wiring 26 for example are performed (steps S138 and S140), as in the first embodiment. A piece of air bridge wiring 36 may alternatively be formed, as in the second embodiment 2.

As described above, the shield extension 50 is formed on the epitaxial crystal growth layer 8 with insulating film 20a interposed therebetween, and unnecessary portions are etched simultaneously with etching for forming the recess 10. Therefore the shield extension 50 can be formed to a position below the projecting portion 14a of the gate electrode 14. In this way, the shield extension 50 extended from the shield electrode 22 can be reliably formed between the projecting portion 14a and the epitaxial crystal growth layer (high-concentration GaAs layer) 8 on the drain side even if the width of recess is considerably small, thus achieving a reduction in capacitance with improved reliability.

In the fourth embodiment, the "second insulating film forming step" of the present invention is embodied by executing step S402; the "metal film forming step" of the present invention by executing step S404; and the "etching step" of the present invention by executing steps S406, S408, and S410.

Fifth Embodiment

Figure 24:
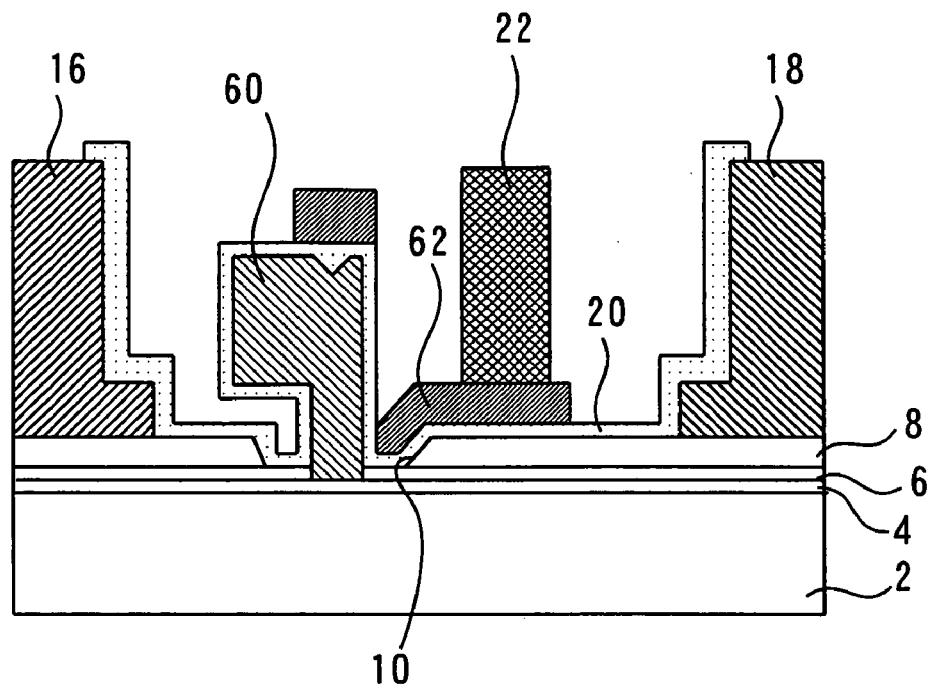
FIG. 24 is a schematic diagram for explaining a semiconductor device in a fifth embodiment of the present invention.

FIG. 24 is a schematic diagram for explaining a semiconductor device in a fifth embodiment of the present invention. The semiconductor device shown in FIG. 24 has the same structure as that of the semiconductor device shown in FIG. 13 except that a gate electrode 60 having no projecting portion on the drain side is provided in place of the gate electrode 14 of the semiconductor device shown in FIG. 13, a shield electrode 62 is formed and a shield electrode 22 is placed on the shield electrode 62. More specifically, the gate electrode 60 in the semiconductor device shown in FIG. 24 has a projecting portion 60a on the source electrode 16 side only. That is, the side surface of the gate electrode 60 facing the drain electrode 18 is flat.

The shield electrode 62 is formed below the shield electrode 22. The shield electrode 62 is placed so as to contact the side surface of the gate electrode 60 on the drain electrode 18 side with insulating film 20 interposed therebetween. In the semiconductor device shown in FIG. 24, the gate electrode 60 has the projecting portion 60a on the source electrode 16 side only and has a flat configuration on the drain side without any projecting portion. Therefore the shield electrode 62 can be formed in the vicinity of the gate electrode 60 on the drain side. The semiconductor device shown in FIG. 24 has such a structure that lines of electric force running between the gate electrode 60 and the epitaxial crystal growth layer 8 on the drain side and the non-depleted channel region on the drain side can be blocked with improved reliability to achieve a reduction in capacitance.

The semiconductor device shown in FIG. 24 can be formed by the same manufacturing method as that shown in FIG. 14 except that the shape of the gate electrode after etching is different from T shape. That is, the gate electrode is formed by etching in step S124 into such a shape as to have the projecting portion 60a on the source electrode 16 side only and no projecting portion on the drain side. The steps shown in FIG. 14 are thereafter executed and the shield electrode 62 is formed in steps S302, S304, and S306. In metal deposition in step S304, a photoresist mask and the gate electrode 60 are used as a mask. Therefore the metal constituting the shield electrode 62 is deposited so that the shield electrode 62 contacts the side surface of the gate electrode 60 on the drain electrode 18 side through insulating film 20. Thus, the shield electrode 62 that contacts the gate electrode 60 through insulating film 20 is formed.

In the fifth embodiment, as described above, the gate electrode 60 is formed so as to have the projecting portion 60a on the source electrode 16 side only to provide a structure in which the shield electrode 62 below the shield electrode 22 can be extended into the recess 10 and brought into contact with of the gate electrode 60 to reliably block electric force lines between the gate electrode 60 and the epitaxial crystal growth layer 8 on the drain side and between the gate electrode 60 and the non-depleted channel region on the drain side and to thereby reduce the capacitance value.

Figure 25:
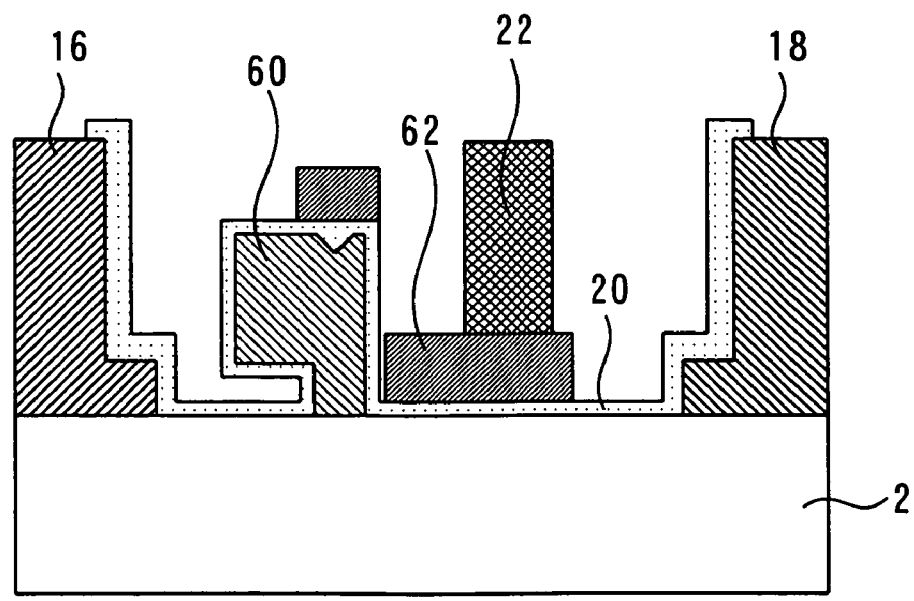
FIG. 25 is a schematic diagram for explaining another example of the semiconductor device in the fifth embodiment of the present invention.

FIG. 25 is a schematic diagram for explaining another example of the semiconductor device in the fifth embodiment. The semiconductor device shown in FIG. 25 has the same structure as that of the semiconductor device shown in FIG. 24 except that the recess 10 is not provided. As shown in FIG. 25, the structure of the shield electrode 62 in this example includes no recess 10. This structure can be applied to a semiconductor device of a planar transistor structure or the like. Also in this case, the same advantage can be obtained. That is, the capacitance can be reduced by the shield electrode 22 and electric force lines can be reliably blocked to further reduce the capacitance value. The shield electrode of the semiconductor device shown in FIG. 25 can be manufactured by the same process as the semiconductor device manufacturing process shown in FIG. 24.

Of each of the semiconductor devices shown in FIGS. 24 and 25, an application using an arrangement such as shown in FIG. 1, in which all the electrodes are embedded in low-k film 24 and wiring 26 connecting the shield electrode 22 and the source electrode 16 is thereafter formed, is also possible. The arrangement in which all the electrodes are covered with low-k film 24 ensures that the semiconductor device has high moisture resistance. An application using an arrangement such as shown in FIG. 9, in which air bridge wiring 36 is formed and the space between the shield electrode 22 and the source electrode 16 is filled with atmospheric air, is also possible. The capacitance can be further reduced in this way.

Sixth Embodiment

Figure 26:
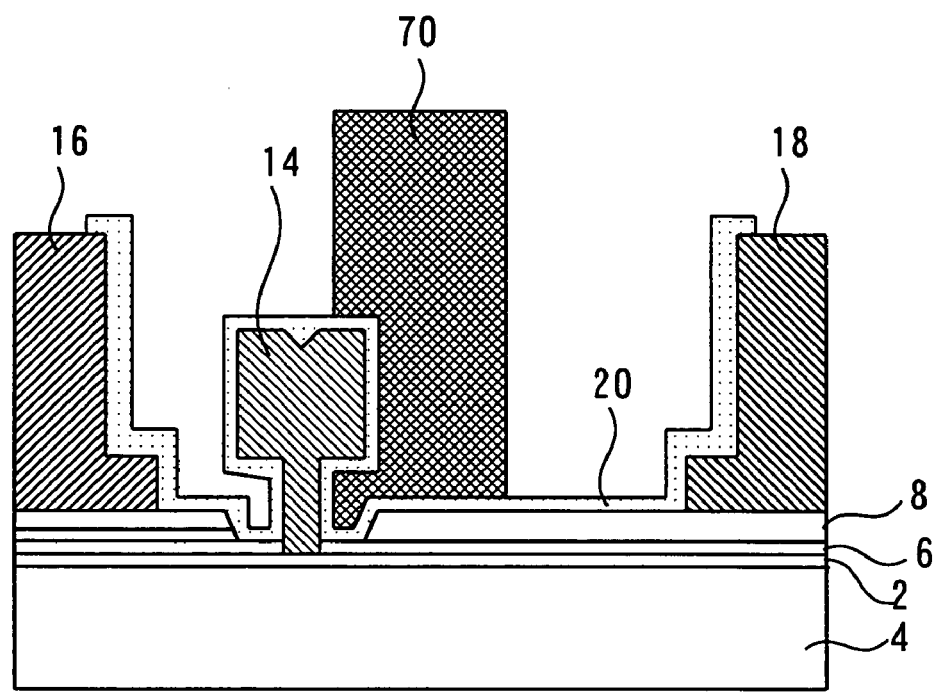
FIG. 26 is a schematic diagram for explaining a semiconductor device in a sixth embodiment of the present invention.

FIG. 26 is a schematic diagram for explaining a semiconductor device in a sixth embodiment of the present invention. The semiconductor device shown in FIG. 26 has the same structure as that of the semiconductor device shown in FIG. 1 except that the shape of a shield electrode is different from that shown in FIG. 1. More specifically, a shield electrode 70 shown in FIG. 26 is formed so as to cover a portion of the gate electrode 14, i.e., the side surface and a portion of the upper surface on the drain electrode 18 side. The construction in which the shield electrode 70 is formed so as to cover the gate electrode 14 on the drain electrode 18 side as described above ensures that the gate-drain capacitance can be reduced and reliable shielding can be achieved between the gate electrode 14 and the epitaxial crystal growth layer 8 on the drain side and between the gate electrode 14 and the non-depleted channel region on the drain side to reduce the capacitance between the gate electrode and the semiconductor substrate 2. Thus, the structure shown in FIG. 26 ensures that the gate-drain capacitance can be reduced.

The semiconductor device shown in FIG. 26 can be manufactured by the same manufacturing process shown in FIG. 2, as is the semiconductor device shown in FIG. 1. That is, by steps S102 to S132, the gate electrode 14, the source electrode 16 and the drain electrode 18 are formed and insulating film 20 is thereafter formed. In step S134, the shield electrode 70 is formed by using a plating process using the gate electrode 14 as a mask. Therefore the space between the gate electrode 14 and the substrate can be completely filled with the material of the shield electrode 70 to reduce the capacitance between the gate electrode 14 and the semiconductor substrate 2 with reliability.

Of the semiconductor device shown in FIG. 26, an application using an arrangement such as shown in FIG. 1, in which all the electrodes are covered with low-k film 24 and wiring 26 connecting the shield electrode 22 and the source electrode 16 is thereafter formed, is also possible. The arrangement in which all the electrodes are covered with low-k film 24 ensures that the semiconductor device has high moisture resistance. An application using an arrangement such as shown in FIG. 9, in which air bridge wiring 36 is formed and the space between the shield electrode 22 and the source electrode 16 is filled with atmospheric air, is also possible. The capacitance can be further reduced in this way.

The features and the advantages of the present invention as described above may be summarized as follows.

According to one aspect of the present invention, the shield electrode connected to the source electrode is formed on a portion of the insulating film between the gate electrode and the drain electrode on the substrate in which the recess is formed. A space is thereby provided between the shield electrode and the gate electrode. In this way, the gate-drain capacitance can be reduced while the increase in the gate-source capacitance is limited.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2005-355211, filed on Dec. 8, 2005 including specification, claims, drawings and summary, on which the Convention priority of the present application is based, are incorporated herein by reference in its entirety.

The invention claimed is:

1. A semiconductor device comprising:
    a substrate having a recess;
    a gate electrode in the recess in the substrate;
    a source electrode and a drain electrode disposed on opposite sides of the gate electrode;
    an insulating film at least on a surface of the gate electrode and a portion in the recess, other than where the gate electrode is located; and
    a shield electrode, wherein the shield electrode
        is disposed on a portion of the insulating film and is located between the gate electrode and the drain electrode, and
        has first and second surfaces that are opposite each other, the first surface being directly opposite, facing, and spaced from the gate electrode and the second surface being directly opposite, facing, and spaced from the drain electrode.

2. The semiconductor device according to claim 1, further comprising an organic film having a low dielectric constant and disposed on the insulating film so that the gate electrode, the source electrode, the drain electrode, and the shield electrode are embedded in the organic film, wherein the shield electrode is electrically connected to the source electrode.

3. The semiconductor device according to claim 1, further comprising air bridge wiring electrically connecting the shield electrode to the source electrode.

4. The semiconductor device according to claim 1, wherein the shield electrode extends from a portion of the insulating film in the recess to a portion facing the drain electrode.

5. The semiconductor device according to claim 4, wherein
    the gate electrode comprises a T-gate electrode having a projecting portion with a relatively longer gate length, and
    the shield electrode extends from a portion immediately below a side surface of the projecting portion of the gate electrode facing the drain electrode.

6. The semiconductor device according to claim 1, wherein
    the gate electrode comprises a T-gate electrode having a projecting portion with a relatively longer gate length, and
    the semiconductor device further comprises a metal film in contact with the shield electrode, under the shield electrode, a portion of the metal film being located on a portion of the insulating film, between the projecting portion and the substrate.

7. The semiconductor device according to claim 1, wherein
    the gate electrode comprises a projecting portion having a relatively longer gate length only toward the source electrode, and
    the shield electrode contacts the insulating film on a side surface of the gate electrode facing the drain electrode.

8. The semiconductor device according to claim 1, wherein the shield electrode covers a portion of the gate electrode in the direction of the drain electrode, with the insulating film interposed between the gate electrode and the shield electrode.

9. The semiconductor device according to claim 1, wherein the gate electrode comprises a T-gate electrode having a leg contacting the substrate and a projecting portion on the leg and having a longer gate length than the leg.

* * * * *